US012696713B2

(12) United States Patent
Choi et al.

(10) Patent No.: US 12,696,713 B2
(45) Date of Patent: Jul. 28, 2026

(54) HEATING UNIT AND SUBSTRATE TREATING APPARATUS INCLUDING THE SAME

(71) Applicant: SEMES CO., LTD., Chungcheongnam-do (KR)

(72) Inventors: Dong Min Choi, Chungcheongnam-do (KR); Hye Ji Kim, Gyeongsangbuk-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 847 days.

(21) Appl. No.: 18/081,636

(22) Filed: Dec. 14, 2022

(65) Prior Publication Data

US 2023/0197474 A1      Jun. 22, 2023

(30) Foreign Application Priority Data

Dec. 17, 2021    (KR) ........................ 10-2021-0182049

(51) Int. Cl.
*H10P 72/00*         (2026.01)
*H10P 72/76*         (2026.01)

(52) U.S. Cl.
CPC ...... *H10P 72/0434* (2026.01); *H10P 72/7612* (2026.01)

(58) Field of Classification Search
CPC ......... H01L 21/67103; H01L 21/67109; H01L 21/67748; H01L 21/683; H01L 21/68742;
(Continued)

(56) References Cited

U.S. PATENT DOCUMENTS 9,991,153 B2      6/2018  Hou
2004/0045509 A1*  3/2004  Or ....................... C23C 16/4583
                                                              118/729
(Continued)

FOREIGN PATENT DOCUMENTS

KR    10-2006-0059809       6/2006
KR    10-2018-0024856       3/2018
(Continued)

OTHER PUBLICATIONS

Office Action dated Sep. 16, 2023 for Korean Patent Application No. 10-2021-0182049 and its English translation from Global Dossier.

*Primary Examiner* — Sang Y Paik
(74) *Attorney, Agent, or Firm* — WOMBLE BOND DICKINSON (US) LLP

(57)                ABSTRACT

The present disclosure provides a heating unit capable of using a bush with holes and a substrate treating apparatus including the same. An apparatus for treating a substrate, includes a heating unit including a heating plate and configured to heat the substrate, a cooling unit configured to cool the substrate, and a transfer unit configured to move the substrate to the heating unit or the cooling unit, wherein the heating plate includes a first plate configured to provide a seating surface to the substrate, and a second plate disposed under the first plate and installed internally with heater(s) and bush(es), and wherein the bush has a hollow configured to provide a lift pin with a space of movement for allowing the lift pin to be elevated or lowered, and includes a plurality of holes formed to extend from the hollow in an outward direction.

19 Claims, 9 Drawing Sheets

(58) Field of Classification Search
CPC ............. H10P 72/0432; H10P 72/0434; H10P 72/3306; H10P 72/70; H10P 72/7612
USPC ...................................................... 219/444.1
See application file for complete search history.

(56) References Cited

U.S. PATENT DOCUMENTS

| | | | |
|---|---|---|---|
| 2004/0132318 A1* | 7/2004 | Kim .......................... | B08B 3/12 134/1 |
| 2006/0216665 A1* | 9/2006 | Fukuoka ................... | F27B 5/04 118/58 |
| 2009/0050621 A1* | 2/2009 | Awazu ................... | H05B 3/148 219/444.1 |
| 2011/0236845 A1* | 9/2011 | Aoki ......................... | F26B 3/20 432/51 |
| 2014/0000843 A1* | 1/2014 | Dunn ................ | H01L 21/68714 165/80.5 |
| 2014/0202635 A1* | 7/2014 | Yamaguchi ......... | H01L 21/6831 279/128 |
| 2014/0265090 A1 | 9/2014 | Hou | |

FOREIGN PATENT DOCUMENTS

| | | |
|---|---|---|
| KR | 10-2026727 | 9/2019 |
| KR | 10-2020-0042255 | 4/2020 |
| KR | 10-2020-0121737 | 10/2020 |

* cited by examiner

HEATING UNIT AND SUBSTRATE TREATING APPARATUS INCLUDING THE SAME

CROSS-REFERENCE TO RELATED APPLICATION

This application claims priority from Korean Patent Application No. 10-2021-0182049 filed on Dec. 17, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a heating unit and a substrate treating or processing apparatus including the same. More particularly, the present disclosure relates to a heating unit used for manufacturing semiconductors and a substrate processing apparatus including the same heating unit.

2. Description of the Related Art

The semiconductor manufacturing process may be continuously performed in a semiconductor manufacturing facility and may be divided into a pre-process and a post-process. The semiconductor manufacturing facility may be installed in a space defined as a fab for manufacturing semiconductors.

The pre-process refers to the process of completing a chip by forming a circuit pattern on a wafer. The pre-process may include a deposition process, a photolithography process, an etching process, an ashing process, an ion implantation process, a cleaning process, and the like. The deposition process forms a thin film on the wafer. The photolithography process transfers a photoresist onto the thin film by using a photo mask. The etching process forms a desired circuit pattern on the wafer by selectively removing undesired portions with chemical substances or reactive gases. The ashing process removes the photoresist remaining after etching. The ion implantation process implants ions into portions related to the circuit pattern to impart characteristics of an electronic device. The cleaning process removes contamination sources from the wafer.

The post-process refers to a process for evaluating the performance of the finished product through the pre-process. The post-process may include at least (1) a primary inspection process that inspects each of the chips on the wafer for an operation to select good and bad products, (2) a packaging process performed through dicing, die bonding, wire bonding, molding, marking, etc on the chips to cut and separate each chip into a product shape, and (3) a final inspection process performed through electrical characteristic inspection, burn-in inspection, etc to finally inspect the product characteristics and reliability.

SUMMARY

The photolithography process may utilize a bake chamber to heat a substrate. In this case, the substrate may be baked in the baking chamber after being seated on a plate by using lift pins.

The lift pins may move in a vertical direction through a plurality of bushes installed inside the plate to seat the substrate on the plate. However, due to the continuous up and down movements of the lift pins, friction would occur frequently between the inside of the bushes and the lift pins, which may generate particles, causing process defects in the lower part of the substrate.

Aspects of the present disclosure provide a heating unit capable of using a bush with holes and a substrate-treating apparatus including the same heating unit.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided an apparatus for treating a substrate, including a heating unit, a cooling unit, and a transfer unit. The heating unit includes a heating plate and is configured to heat the substrate. The cooling unit is configured to cool the substrate. The transfer unit is configured to move the substrate to the heating unit or the cooling unit. Here, the heating plate includes a first plate configured to provide a seating surface to the substrate, and a second plate disposed under the first plate and installed internally with one or more heaters and one or more bushes. The bush has a hollow configured to provide a lift pin with a space of movement for allowing the lift pin to be elevated or lowered and includes a plurality of holes formed to extend from the hollow in an outward direction.

The holes may be formed in a vertical direction with respect to a longitudinal direction of the bush or may be formed to be inclined with respect to the longitudinal direction of the bush.

The holes may each be partially formed in the surface of the bush.

The hollow of the bush may include a first subspace, and a second subspace that is narrower in width than the first subspace, wherein the holes may be connected to the first subspace.

The lift pin may have an end configured, when elevated, to pass through the second subspace first, and when lowered, to pass through the first subspace first.

The second plate of the heating plate may be formed internally with passages that connect to the holes and to a suction member for removing particles generated in the hollow of the bush.

The lift pin may include a first body, and a second body joined with the first body and having a width wider than the first body.

The lift pin when inserted into the hollow of the bush may have the first body positioned above the second body.

The second body of the lift pin may have a width corresponding to at least some of the hollow of the bush.

The lift pin may be adjustable in length with the first body disposed internally of the second body and moving toward and away from the second body.

The second body of the lift pin may have a length corresponding to at least some of the hollow of the bush.

The first plate of the heating plate may have a surface formed with a groove, and the bush may be fixed to the first plate through the groove.

The bush may include a first bush installed on the second plate of the heating plate, and a second bush coupled to the first bush and fixed to the first plate through the groove.

The second plate of the heating plate may include a plurality of bushes consecutively installed in a height direction, and the bush including the holes may be a bush disposed at an uppermost level among the plurality of bushes.

According to yet another aspect of the present disclosure, there is provided an apparatus for treating a substrate, including a heating unit, a cooling unit, and a transfer unit. The heating unit includes a heating plate and is configured to heat the substrate. The cooling unit is configured to cool the substrate. The transfer unit is configured to move the substrate to the heating unit or the cooling unit. Here, the heating plate includes a first plate configured to provide a seating surface to the substrate, and a second plate disposed under the first plate and installed internally with one or more heaters and one or more bushes. The bush has a hollow configured to provide a lift pin with a space of movement for allowing the lift pin to be elevated or lowered and includes a plurality of holes formed to extend from the hollow in an outward direction. The holes are formed in a vertical direction with respect to a longitudinal direction of the bush or are formed to be inclined with respect to the longitudinal direction of the bush. The lift pin includes a first body, and a second body joined with the first body and has a width wider than the first body. The second body has a width corresponding to at least some of the hollow of the bush. The first plate has a surface formed with a groove, and the bush is fixed to the first plate through the groove.

According to yet another aspect of the present disclosure, there is provided a heating unit in an apparatus for processing a substrate, the heating unit including a heating plate, a cover, and an actuator. The heating plate is configured to heat the substrate and includes a body configured to provide a seating surface to the substrate, and one or more heaters installed internally of the body. The cover is configured to cover an upper portion of the heating plate. The actuator is configured to move the cover. Here, the heating plate includes a first plate configured to provide a seating surface to the substrate; and a second plate disposed under the first plate and installed internally with one or more heaters and one or more bushes. The bush has a hollow configured to provide a lift pin with a space of movement for allowing the lift pin to be elevated or lowered and includes a plurality of holes formed to extend from the hollow in an outward direction.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
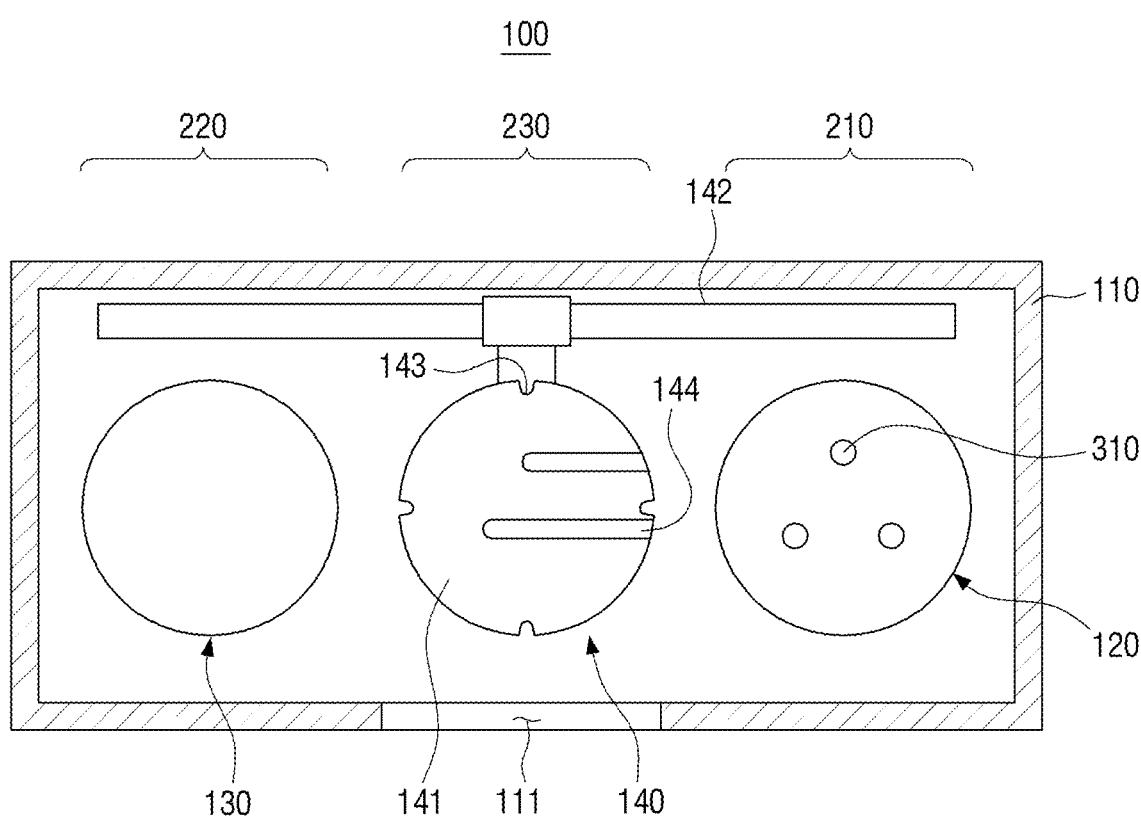
FIG. 1 is a schematic plan view of a structure of a substrate processing apparatus according to at least one embodiment of the present disclosure.
Figure 1:
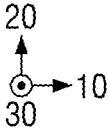

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. Like reference numerals refer to like elements throughout the specification.

It will also be understood that when an element or a layer is referred to as being "on" another element or layer, it can be not only directly on the other element or layer, but also indirectly thereon with intervening elements or layers being present. In contrast, when an element is referred to as being "directly on" another element, there are no intervening elements present.

Spatially relative terms, such as "below," "beneath," "lower," "above," "upper," and the like, may be used herein for ease of description to convey one element's or feature's relationship to another element(s) or feature(s) as illustrated in the drawings. It will be understood that the spatially relative terms are intended to encompass different orientations of the device in use or operation in addition to the orientation depicted in the drawings. For example, when a device in the drawings is turned over, elements described as "below" or "beneath" other elements or features would then be oriented "above" the other elements or features. Thus, the illustrative term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, components, and/or sections, these elements, components, and/or sections should not be limited by these terms. These terms are only used to distinguish one element, component, or section from another element, component, or section. Thus, a first element, first component, or first section discussed below could be termed a second element, second component, or second section without departing from the teachings of the present disclosure.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some embodiments of the present disclosure will be described in detail with reference to the accompanying drawings. In the following description, like reference numerals designate like elements, although the elements are shown in different drawings. Further, in the following description of some embodiments, a detailed description of related known components and functions when considered to obscure the subject of the present disclosure will be omitted for the purpose of clarity and for brevity.

The present disclosure relates to a heating unit capable of solving the particle matter caused by friction between a bush and a lift pin, and a substrate processing apparatus including the same. Hereinafter, the present disclosure will be described in detail with reference to drawings and others.

Figure 2:
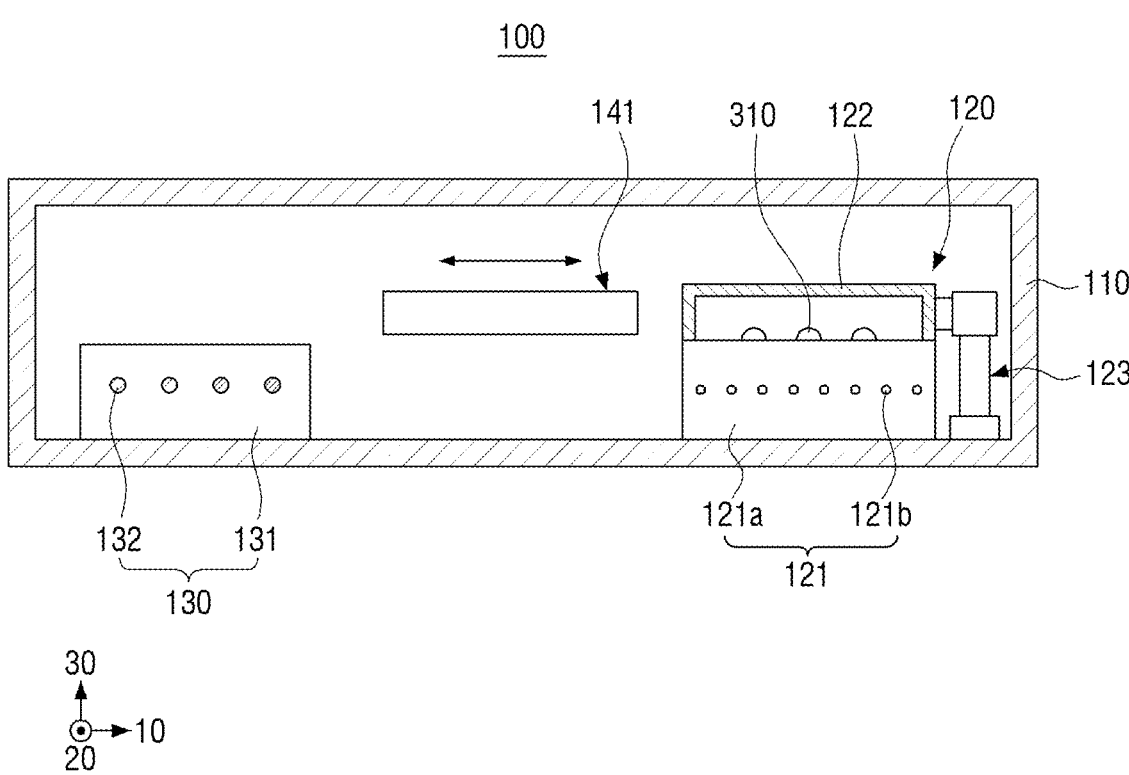
FIG. 2 is a schematic cross-sectional view of a structure of a substrate processing apparatus according to at least one embodiment of the present disclosure.

FIG. 1 is a schematic plan view of a structure of a substrate processing apparatus 100 according to at least one embodiment of the present disclosure, and FIG. 2 is a schematic cross-sectional view of the structure of the substrate processing apparatus 100 according to at least one embodiment of the present disclosure.

According to FIGS. 1 and 2, the substrate processing apparatus 100 may be configured to include a housing 110, a heating unit 120, a cooling unit 130, and a transfer unit 140.

The substrate processing apparatus 100 is adapted to heat and cool a substrate, e.g., glass or wafer. When performing a photolithography process on the substrate, the substrate processing apparatus 100 may heat and cool the substrate. The substrate processing apparatus 100 may be provided as, for example, a bake chamber for performing a baking process.

The photolithography process may include a photoresist coating process, an exposure process, a development process, a baking process, and the like. In this case, the substrate processing apparatus 100 may heat and/or cool the substrate before or after performing the photoresist coating process, that is, before or after applying a photoresist (PR) on the substrate.

However, the embodiments of the present disclosure are not limited thereto. The substrate processing apparatus 100 may heat and/or cool the substrate before or after performing the exposure process. Alternatively, the substrate processing apparatus 100 may heat and/or cool the substrate before or after performing the development process.

The housing 110 is to provide a space for processing the substrate. The housing 110 may be installed to accommodate the heating unit 120, the cooling unit 130, the transfer unit 140, and the like therein to enable heating and cooling processing for the substrate.

The sidewall of the housing 110 may have an inlet 111 through which the substrate enters and exits. The housing 110 may be provided with at least one inlet 111. The inlet 111 may be always open, and although not shown in FIG. 1, it may be provided to be openable and openable through a door.

The inner space of the housing 110 may be divided into a heating region 210, a cooling region 220, and a buffer region 230. Here, the heating region 210 refers to where the heating unit 120 is disposed, and the cooling region 220 refers to where the cooling unit 130 is disposed. The heating region 210 may be provided to be the same as or wider than the width of the heating unit 120. Similarly, the cooling region 220 may be provided to be the same as or wider than the width of the cooling unit 130.

The buffer area 230 refers to where a transport plate 141 of the transfer unit 140 is disposed. The buffer region 230 may be provided between the heating region 210 and the cooling region 220. With the buffer region 230 provided in this manner, the heating unit 120 and the cooling unit 130 may be sufficiently spaced apart to prevent thermal interference between them. As with the heating region 210 and the cooling region 220, the buffer region 230 may be provided to be the same as or wider than the width of the transport plate 141.

When respectively disposed in the housing 110 at the heating region 210, the cooling region 220, and the buffer region 230, the cooling unit 130, the transfer unit 140, and the heating unit 120 may be arranged in the order in a first direction as indicated by the arrow 10. However, the embodiments of the present disclosure are not limited thereto. This embodiment may also arrange the heating unit 120, the transfer unit 140, and the cooling unit 130 in the stated order, in the first direction 10.

The heating unit 120 is adapted to heat the substrate. The heating unit 120 may provide gas on the substrate when heating the substrate. The heating unit 120 may provide, for example, a hexamethyldisilane (Hexa-Methyl-Di-Silane) gas, and supplying such a gas can effect an improved adhesion rate of the photoresist to the substrate.

The heating unit 120 may be configured to include a heating plate 121 or a hot plate, a cover 122, and an actuator 123 to heat the substrate.

The heating plate 121 applies heat to the substrate. The heating plate 121 may be configured to include a body portion 121a and one or more heaters 121b for this purpose.

The body portion 121a supports the substrate when applying heat to the substrate. The body portion 121a may be formed to have the same diameter as or larger diameter than that of the substrate.

The body portion 121a may be manufactured by using a metal having excellent heat resistance. Alternatively, the body portion 121a may be manufactured using a metal having excellent fire resistance. The body portion 121a may be manufactured using, for example, ceramics such as aluminum oxide ($Al_2O_3$), aluminum nitride (AIN), or the like.

Meanwhile, although not shown in FIGS. 1 and 2, the body portion 121a may include a plurality of vacuum holes formed to penetrate in the vertical direction (a third direction 30). Here, the vacuum hole may serve to fix the substrate by forming a vacuum pressure when heat is applied to the substrate.

Although not shown in FIGS. 1 and 2, the body portion 121*a* may be divided into an upper plate and a lower plate disposed under the upper plate. Here, the substrate may be seated on the upper plate, and the heater 121*b* may be installed inside the lower plate.

The heater 121*b* is adapted to apply heat to the substrate positioned on the body portion 121*a*. A plurality of such heaters 121*b* may be installed internally of the body portion 121*a*. The heater 121*b* may be provided as a heating resistor (e.g., a heating wire) to which current is applied, but in some embodiments, as long as heat can be effectively applied to the substrate on the body portion 121*a*, the heater 121*b* may also be provided otherwise than the heating resistor.

The cover 122 is formed to cover the upper portion of the heating plate 121 when the heating plate 121 heats the substrate. The cover 122 may move in the vertical direction (third direction 30) under the control of the actuator 123 to open and close the upper portion of the heating plate 121.

The actuator 123 is to move the cover 122 in the vertical direction (third direction 30). When the substrate is seated on the upper portion of the heating plate 121 for heat treatment of the substrate, the actuator 123 may move the cover 122 downwardly to completely cover the upper portion of the heating plate 121. Additionally, upon completion of the heat treatment on the substrate, the actuator 123 may move the cover 122 upwardly of the housing 110 to expose the upper portion of the plate 121 for allowing the transfer unit 140 to transfer the substrate to the cooling unit 130.

The cooling unit 130 is adapted to cool the substrate heated by the heating unit 120. To this end, the cooling unit 130 may be configured to include a cooling plate 131 and a cooling member 132.

High-temperature heat as applied to the substrate through the heating unit 120 may cause warpage in the substrate. The cooling unit 130 may serve to cool the substrate heated by the heating unit 120 to an appropriate temperature, thereby restoring the substrate to its original state.

The cooling member 132 is formed inside the cooling plate 131. The cooling member 132 may be provided in the form of a flow path through which a cooling fluid flows.

The transfer unit 140 is to move the substrate to the heating unit 120 or the cooling unit 130. For this purpose, the transfer unit 140 may have a hand to which the transport plate 141 is distally coupled, and a guide rail 142 along which the transport plate 141 is movable toward where the heating unit 120 or the cooling unit 130 is located.

The transport plate 141 is in the form of a disk and may be formed to have a diameter corresponding to the substrate. The transport plate 141 may include a plurality of notches 143 formed along the edge and may include a plurality of guide grooves 144 having a slit shape on an upper surface thereof.

The guide grooves 144 may each be formed extending from the edge of the transport plate 141 in a direction toward the center thereof. In this case, the plurality of guide grooves 144 may be formed to be spaced apart from each other in the same direction (first direction 10). The guide grooves 144 may prevent the transfer plate 141 from interfering with lift pins 310 provided in the heating unit 120 when a substrate is taken over between the transfer plate 141 and the heating unit 120.

The heating of the substrate is performed with the substrate placed directly on the heating plate 121, while the cooling of the substrate is performed with the cooling plate 131 contacted by the transport plate 141 on which substrate is placed. To facilitate heat transfer between the cooling plate 131 and the substrate, the transfer plate 141 may be made of a material (e.g., metal) having excellent heat transfer efficiency.

Meanwhile, although not shown in FIGS. 1 and 2, the transfer unit 140 may receive a substrate through the inlet 111 of the housing 110 from a substrate transfer robot installed outside.

The lift pins 310 each have a free-fall structure and serve to elevate or lower the substrate on the heating plate 121. These lift pins 310, in a baking process on the substrate, may be lowered on the heating plate 121 upon receiving the substrate from the transfer unit 140 to seat the substrate on the heating plate 121. Additionally, the lift pins 310, upon completion of the baking process for the substrate, may be elevated on the heating plate 121 to transfer the substrate to the transfer unit 140. To this end, the lift pins 310 may be formed to penetrate the heating plate 121 in the vertical direction (third direction 30).

As with the body portion 121*a*, the lift pin 310 may be manufactured using a metal having excellent heat resistance or may be manufactured using a metal having excellent fire resistance as its material. In this case, the lift pin 310 may be manufactured using the same metal as the body portion 121*a*, but may also be manufactured using different metals as its material.

The lift pin 310 may be operated by using, for example, a Linear Motor guide system (LM guide system), and may be controlled by a plurality of cylinders connected to the LM guide system. The LM guide system is advantageously capable of coping with high temperatures and high vibrations.

Meanwhile, multiple lift pins 310 may be installed to stably support the substrate when elevating or lowering the substrate on the heating plate 121. As shown in FIGS. 1 and 2, three lift pins 310 may be installed.

As described above, a plurality of bushes may be installed inside the body portion 121*a* of the heating plate 121, and the lift pins 310 may be elevated or lowered through the space formed in the bushes to elevate or lower the substrate on the heating plate 121.

However, friction may occur between the bushes and the lift pins 310 from time to time due to the deformation according to the temperature of the heating plate 121 and the repeated lifting and lowering of the lift pins 310, which may cause particles to adhere to the substrate, and in turn, possible process failure.

In some embodiments, the bush may be formed with holes for solving this issue. The following discusses this issue in detail with reference to the drawings.

Figure 3:
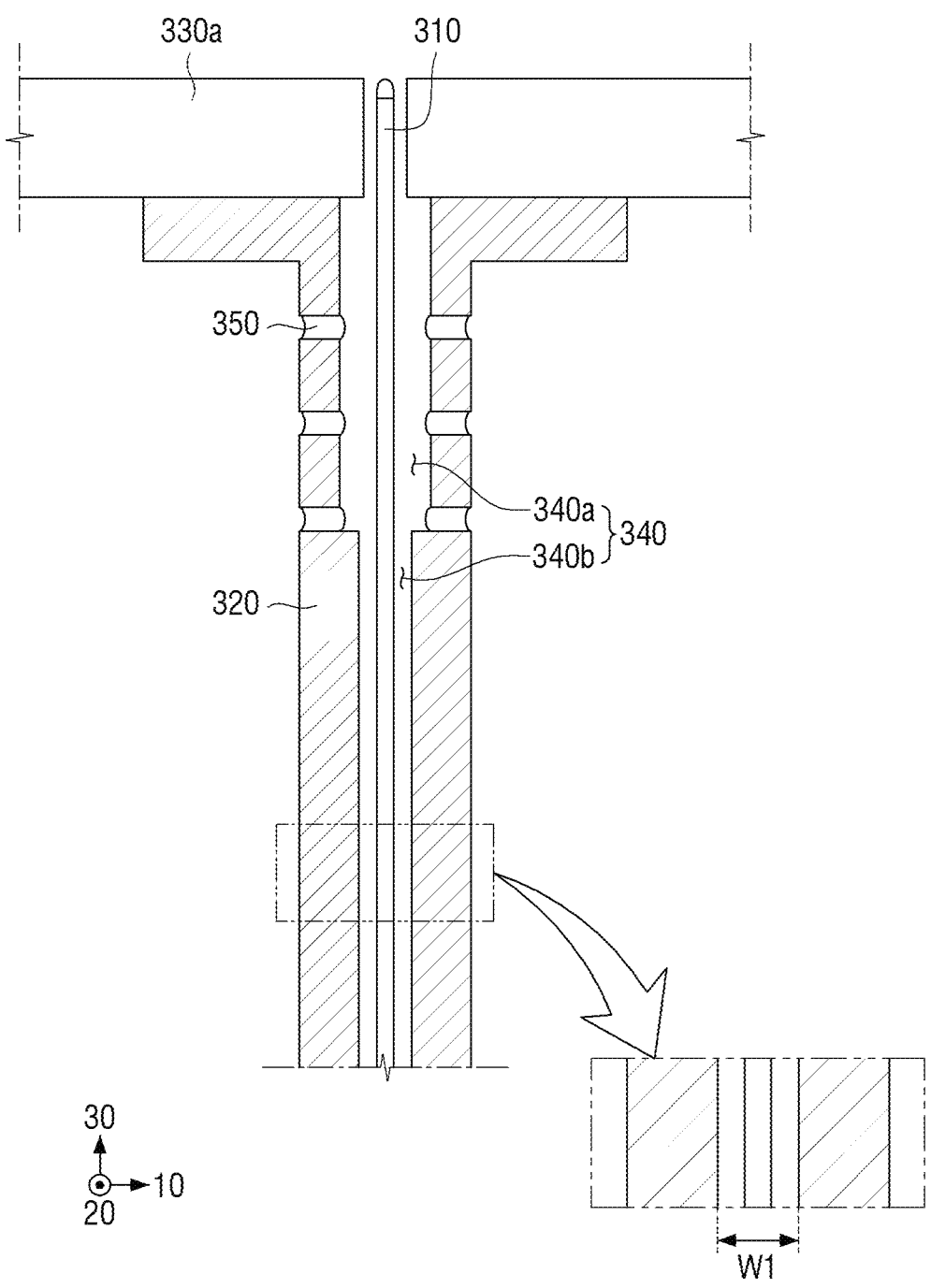
FIG. 3 is a first cross-sectional view partially illustrating an internal structure of a heating plate as a component of a substrate processing apparatus according to at least one embodiment of the present disclosure.

FIG. 3 is a first cross-sectional view partially illustrating an internal structure of a heating plate 121 as a component of a substrate processing apparatus according to at least one embodiment of the present disclosure. The following description refers to FIG. 3.

The bush 320 is installed to move the lift pin 310 in the vertical direction (third direction 30) within the body portion 121*a* of the heating plate 121. While being elevated or lowered within the bush 320, the lift pin 310 may elevate or lower the substrate on the heating plate 121.

Although not shown in FIG. 3, the bushes 320 may each be installed in a lower plate constituting the body portion 121*a* of the heating plate 121. In this case, each bush 320 may be installed to be elongated in the vertical direction (third direction 30), and it may be installed as a single elongated structure or as multiple units of short bushes aligned in close contact in the vertical direction.

The following describes the bush 320 when installed as a single elongated structure as an example.

Disposed on the top of the bush 320 may be an upper plate 330a constituting the body portion 121a of the heating plate 121, and the bush 320 may be internally formed with a hollow 340 in which the lift pin 310 may be elevated and lowered.

The hollow 340 of the bush 320 may be divided into a first subspace 340a and a second subspace 340b. The first subspace 340a may be formed to be greater in width than the second subspace 340b and may be disposed at an upper portion of the bush 320. On the other hand, the second subspace 340b may be formed to be smaller in width than the first subspace 340a and may be disposed at a lower portion of the bush 320. Hereinafter, the width of the second subspace 340b is defined as W1.

The bush 320 may include a plurality of holes 350 for externally discharging particles that may be generated according to occasional friction with the lift pin 310. The holes 350 may be elongated perpendicular (in the first direction 10 or second direction 20) to the longitudinal direction (third direction 30) of the bush 320 to be connected to the hollow 340.

The holes 350 may be formed in a portion of the bush 320. The holes 350 may be formed in, for example, an upper portion of the bush 320. In this case, the holes 350 may be connected to the first subspace 340a of the bush 320.

However, the embodiments of the present disclosure are not limited thereto. Of multiple holes 350 formed in a portion of the bush 320, some holes 350 may be formed to be connected to the first subspace 340a of the bush 320, and some other holes 350 may be formed to be connected to the second subspace 340b of the bush 320.

On the other hand, the multiple holes 350 may be formed over the entire surface of the bush 320, and a single hole 350 may be alternatively formed in the bush 320.

Figure 4:
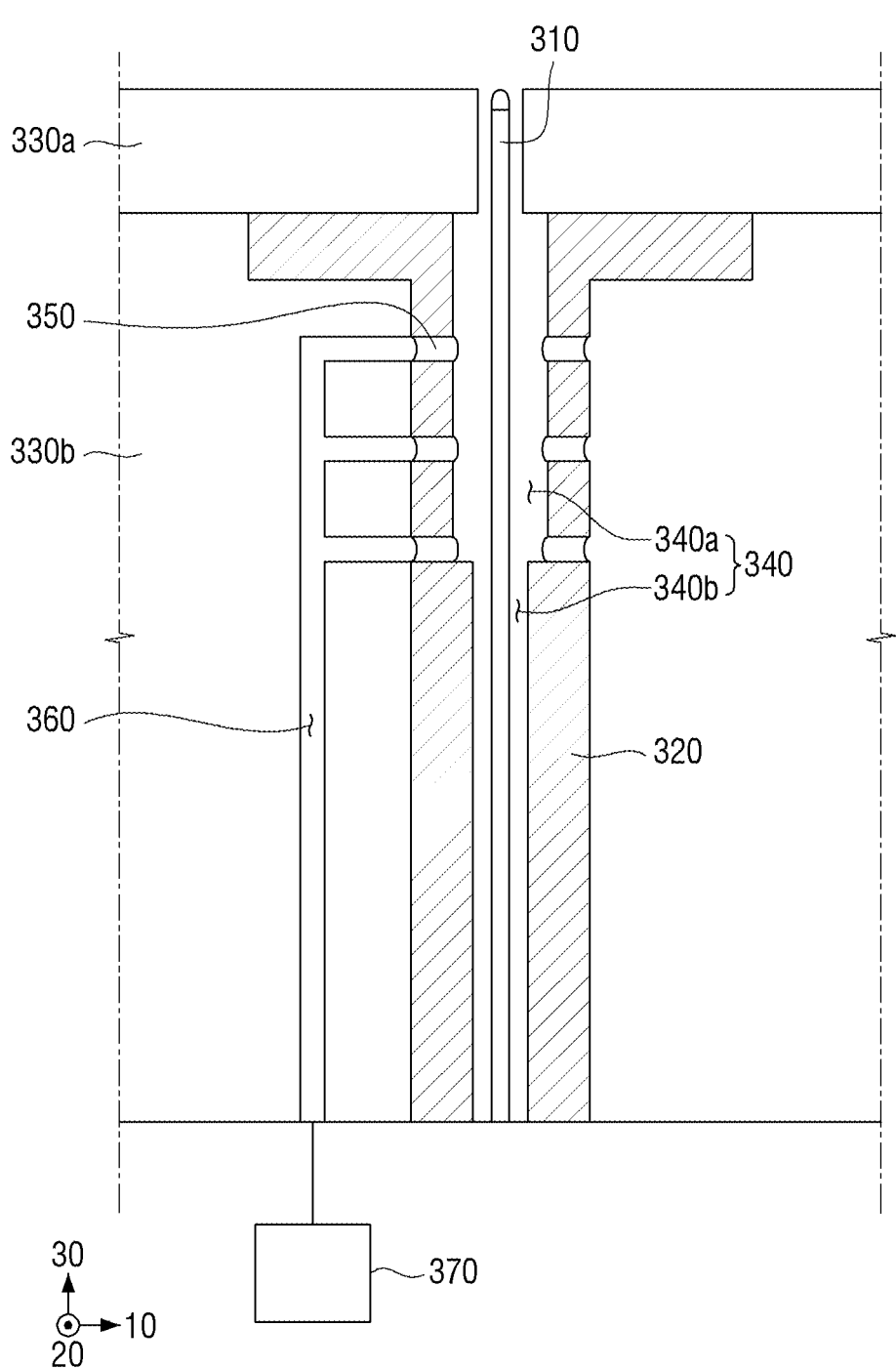
FIG. 4 is a diagram for illustrating a particle processing method according to at least one embodiment of the present disclosure.

To prevent the particles from being adhered to the substrate, the particles moved from the hollow 340 of the bush 320 to the holes 350 need to be discharged to the outside. Taking account of this need, some embodiments as shown in FIG. 4 provide a lower plate 330b of the heating plate 121 with a passage 360 connected to the holes 350 of the bush 320 and introduce a suction member 370 to be connected to the passage 360 for allowing the particles moved to the holes 350 to be suctioned for disposal. FIG. 4 is a diagram for illustrating a particle processing method according to at least one embodiment of the present disclosure.

The holes 350 have been described as being formed elongated perpendicular to the longitudinal direction of the bush 320. However, the embodiments of the present disclosure are not limited thereto. The plurality of holes 350 may be formed to be inclined, i.e., inclined at a predetermined angle with respect to the longitudinal direction of the bush 320.

Figure 5:
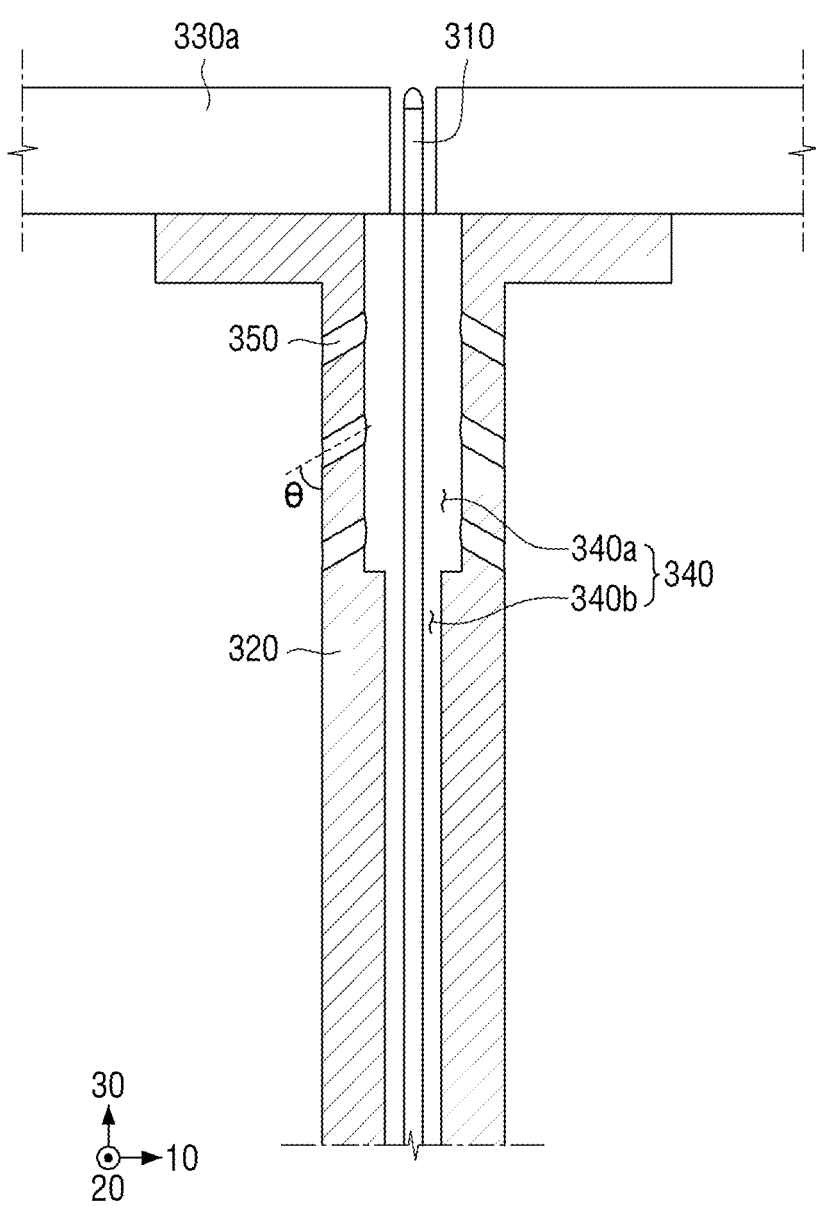
FIG. 5 is a second cross-sectional view partially illustrating an internal structure of a heating plate component of a substrate processing apparatus according to at least one embodiment of the present disclosure.

In this case, for example, the multiple holes 350 may be formed as shown in FIG. 5 to be inclined at an angle θ downward with respect to the longitudinal direction of the bush 320. FIG. 5 is a second cross-sectional view partially illustrating an internal structure of a heating plate component of a substrate processing apparatus according to at least one embodiment of the present disclosure. Additionally, the multiple holes 350 may be formed to be inclined at a predetermined angle upward with respect to the longitudinal direction of the bush 320.

Alternatively, some of the multiple holes 350 may be formed elongated perpendicular to the longitudinal direction of the bush 320, and some other holes 350 may be formed to be inclined at a predetermined angle downward with respect to the longitudinal direction of the bush 320. Yet alternatively, some of the multiple holes 350 may be formed elongated perpendicular to the longitudinal direction of the bush 320, and some other holes 350 may be formed to be inclined at a predetermined angle upward with respect to the longitudinal direction of the bush 320. Yet alternatively, some of the multiple holes 350 may be formed to be inclined at a predetermined angle downward with respect to the longitudinal direction of the bush 320, and some other holes 350 may be formed to be inclined at a predetermined angle upward with respect to the longitudinal direction of the bush 320. Yet alternatively, some of the multiple holes 350 may be formed elongated perpendicular to the longitudinal direction of the bush 320, some other holes 350 may be formed to be inclined downward with respect to the longitudinal direction of the bush 320, and yet some other holes 350 may be formed to be inclined upward with respect to the longitudinal direction of the bush 320.

Meanwhile, the bush 320 may have wing portions that are each elongated in a direction perpendicular to the longitudinal direction (first direction 10) of the bush 320 and are used to fasten the bush 320 to the upper plate 330a and the lower plate 330b of the heating plate 121. In this case, the bush 320 may be fastened to the upper plate 330a and the lower plate 330b by using bolts and washers.

The lift pin 310 may move through the hollow 340 of the bush 320 to maintain its up and down movements in the vertical direction. However, particles may be generated by deformation of the heating plate 121 due to the temperature, continuous up and down movements of the lift pins 310, etc., resulting in the particles adhered to the substrate and, in turn, process defects.

The particles may be generated as the lift pin 310 is distorted depending on the tolerance between the bush 320 and the lift pin 310. In particular, the particles may be generated due to friction that occurs between the bush 320 and the lift pin 310 when the latter fails to maintain its perpendicular extension (in third direction 30) with respect to the width direction (first direction 10) of the heating plate 121 and is distorted.

To minimize the friction between the bush 320 and the lift pin 310, some embodiments minimize the distortion (or deflection) of the lift pin 310 by increasing the contact portion between the lift pin 310 and the bush 320. The following will discuss this matter.

Figure 6:
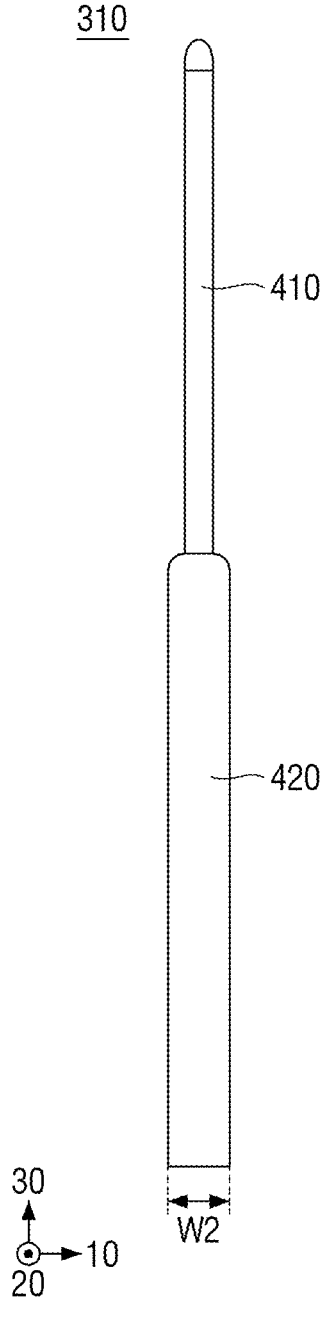
FIG. 6 is a first schematic diagram illustrating a structure of a lift pin that may be installed in a heating unit component of a substrate processing apparatus according to at least one embodiment of the present disclosure.

FIG. 6 is a first schematic diagram illustrating a structure of a lift pin 310 that may be installed in a heating unit component of a substrate processing apparatus according to at least one embodiment of the present disclosure.

According to FIG. 6, the lift pin 310 may include a first body 410 and a second body 420.

The first body 410 and the second body 420 are combined to constitute the body of the lift pin 310. The first body 410 and the second body 420 may be integrally formed, but may also be detachably formed.

The first body 410 may be disposed above the second body 420. The first body 410 may be formed to have a narrower width than the second body 420. Therefore, the second body 420 disposed below the first body 410 may be formed to have a wider width than the first body 410.

The first body 410 may be formed to have the same length as the second body 420. However, the embodiments of the present disclosure are not limited thereto. The first body 410 may be formed to have a relatively longer length than the second body 420. Alternatively, the first body 410 may be formed to have a relatively shorter length than the second body 420.

Figure 7:
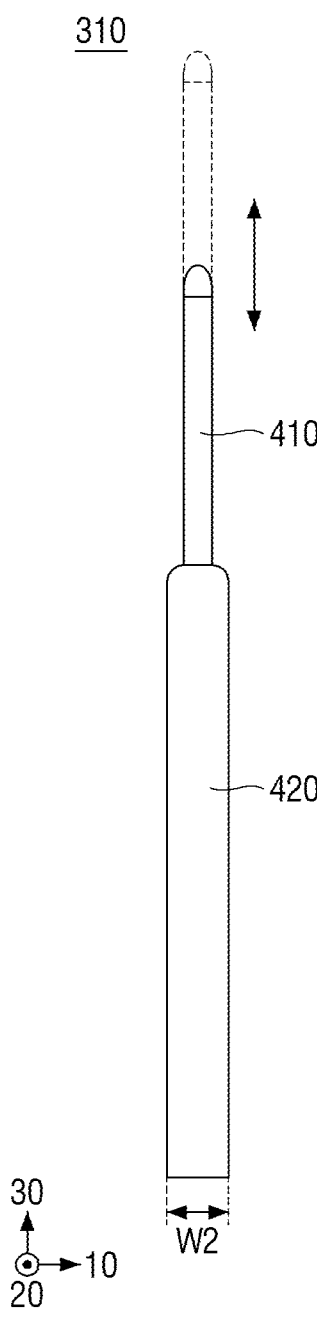
FIG. 7 is a second schematic diagram illustrating a structure of a lift pin that may be installed in a heating unit component of a substrate processing apparatus according to at least one embodiment of the present disclosure.

The length of the first body 410 may be variable on the second body 420 as shown in FIG. 7. When the length of the first body 410 is shortened, the remaining portion may be inserted into the second body 420. FIG. 7 is a second schematic diagram illustrating a structure of a lift pin 310 that may be installed in a heating unit component of a substrate processing apparatus according to at least one embodiment of the present disclosure.

When the lift pin 310 is formed of the first body 410 and the second body 420 having different widths as described above, the width W2 of the second body 420 may correspond to a width W1 of the second subspace 340b of the bush 320 (W2=W1). In particular, the outer diameter of the lift pin 310 and the inner diameter of the bush 320 may have the same value (e.g., 3 mm).

Figure 8:
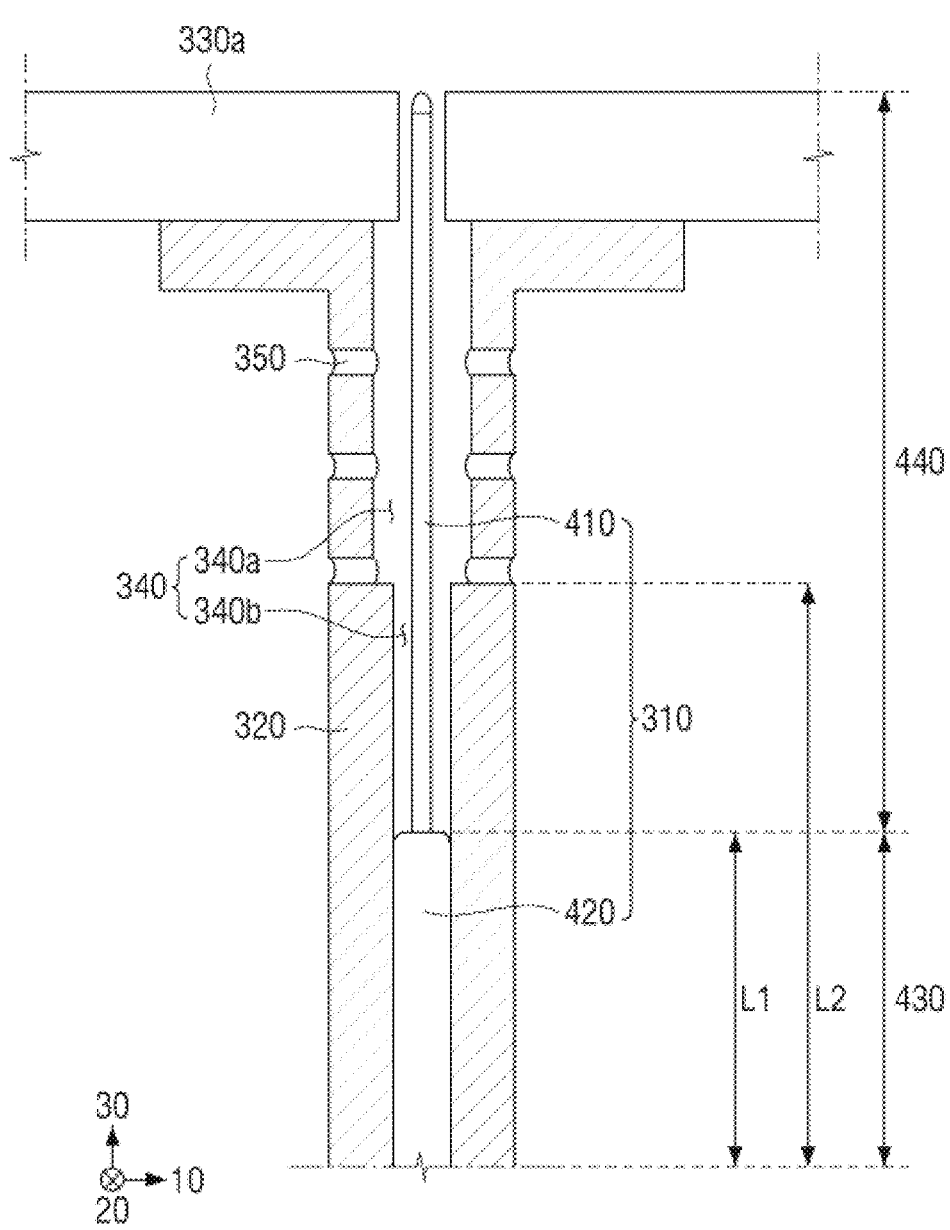
FIG. 8 is a third cross-sectional view partially illustrating an internal structure of a heating plate as a component of a substrate processing apparatus according to at least one embodiment of the present disclosure.

With such formations of the second body 420 of the lift pin 310 widthwise, the present disclosure can provide an extended length 430 of the lift pin 310 to be in contact with the inner surface of the bush 320 as shown in FIG. 8, whereby reducing a distortion-prone length 440 of the lift pin 310 in the hollow 340 of the bush 320. This can effect the minimized distortion (or deflection) of the lift pin 310. FIG. 8 is a third cross-sectional view partially illustrating an internal structure of a heating plate as a component of a substrate processing apparatus according to at least one embodiment of the present disclosure.

When the lift pin 310 is installed in the hollow 340 of the bush 320, the second body 420 of the lift pin 310 may have its length L1 to be equal to a length L2 of the second subspace 340b of the bush 320 (L1=L2). However, the embodiments of the present disclosure are not limited thereto. The second body 420 of the lift pin 310 may have the length L1 to be shorter than the length L2 of the second subspace 340b of the bush 320 (L1<L2). Alternatively, the length L1 of the second body 420 of the lift pin 310 may be longer than the length L2 of the second subspace 340b of the bush 320 (L1>L2).

Figure 9:
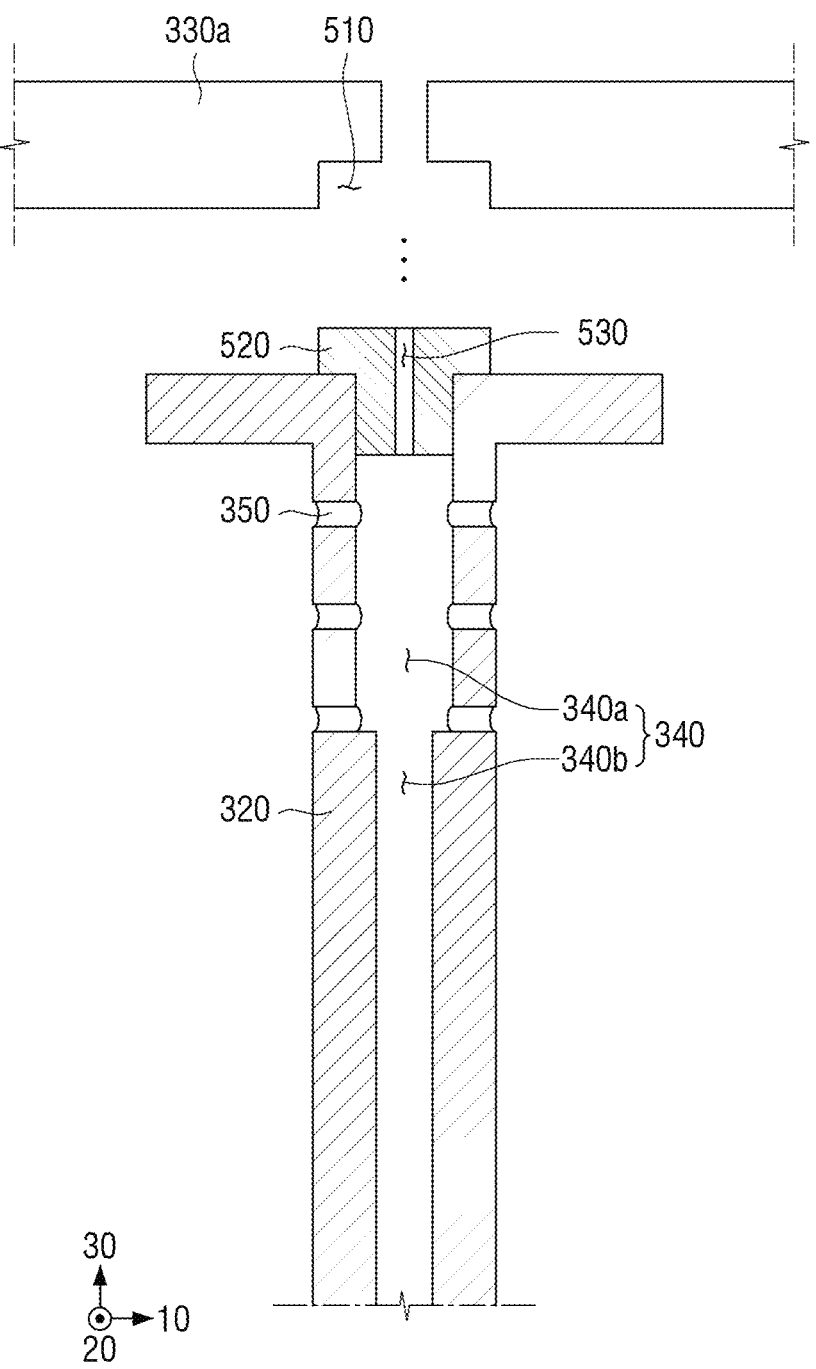
FIG. 9 is a fourth cross-sectional view partially illustrating an internal structure of a heating plate as a component of a substrate processing apparatus according to at least one embodiment of the present disclosure.

FIG. 9 is a fourth cross-sectional view partially illustrating an internal structure of a heating plate 121 as a component of a substrate processing apparatus according to at least one embodiment of the present disclosure. The following description refers to FIG. 9.

As described above, the bush 320 may be installed in the lower plate in the body portion 121a of the heating plate 121, wherein the upper surface of the bush 320 may be exposed on the top surface of the lower plate. Additionally, the upper plate 330a in the body portion 121a may be installed in close contact with the upper surface of the bush 320.

A conventional fastening of the bush 320 to the heating plate 121 has difficulty due to a large number of bolting points, which leads to poor assembly during the centering setting of the bush 320.

The present disclosure in some embodiments can minimize defects related to the centering setting of the bush 320 by improving the joint thereof, thereby minimizing distortion of the lift pin 310 that moves through the hollow 340 of the bush 320. This is achieved by some embodiments utilizing another bush 520 coupled with the bush 320. The following refers to the bush 320 as a first bush 320, and the bush 520 as a second bush 520.

The upper plate 330a is formed, on its bottom surface, that is, a portion in contact with the upper surface of the first bush 320, with a groove 510 for fastening with the first bush 320. The lower plate 330b in the body portion 121a is first fitted with the first bush 320 which is then coupled through the first subspace 340a thereof with the second bush 520. The assembled second bush 520 on top of the first bush 320 is then fixed to the upper plate 330a through the groove 510. The present disclosure can obtain the effect of shortening the assembly man-hours and minimizing assembly defects.

On the other hand, in some embodiments, the first bush 320 and the second bush 520 may be coupled first, and the first bush 320 and the second bush 520 may be fixed to the upper plate 330a and the lower plate 330b, respectively. Alternatively, the first bush 320 and the second bush 520 may be integrally formed and then fixed to the upper plate 330a and the lower plate 330b.

Meanwhile, the second bush 520 is also duly formed with an inner hole 530 through which the lift pin 310 can pass as with the first bush 320. In this case, the inner hole 530 may be formed in the height direction (third direction 30). As shown also in FIG. 9, the second bush 520 may be formed to have a length that can occupy some of the first subspace 340a of the first bush 320, and may be formed to have a length that runs the entire subspace 340a of the first bush 320.

The next case regards an arrangement of multiple units of short bushes 320.

When the multiple bushes 320 are installed in the lower plate 330b, the bushes 320 may be installed in a height direction (third direction 30) of the lower plate 330b. In this case, the configurations of the bush 320 as described with reference to FIGS. 3 to 9 may be applied exclusively to the topmost bush disposed in the lower plate 330b, but the embodiments of the present disclosure are not necessarily limited thereto. It should be understood that the configurations of the bush 320 as described with reference to FIGS. 3 to 9 may be equally applied to at least one of the remaining bushes except for the topmost bush.

The above has described the heating unit 120 as applied to a semiconductor manufacturing process, for example, a photolithography process, and the substrate processing apparatus 100 including the same heating unit 120 with reference to FIGS. 1 to 9. Also discussed are the structures of the lift pins 310 and the bushes 320 of various embodiments applied to the heating unit 120.

The present disclosure is related to a method of removing particles that may be generated due to the continuous up and down movements of the lift pins 310, and a method of minimizing the particles through the centering correction structure of the lift pins 310. The particle removing method has been described with reference to FIGS. 3 to 5, and the particle minimizing method has been described with reference to FIGS. 6 to 8.

The features of the present disclosure can be summarized as follows.

First, by installing the side holes 350 in the bush 320 and discharging the particles to the outside through the side holes 350, the present disclosure can prevent a process defect of the substrate. The present disclosure, as described with reference to FIGS. 3 to 5, removes particles generated inside the bush 320 due to friction between the lift pin 310 and the bush 320 by providing the upper portion of the bush 320 with particle discharge holes 350.

Second, by increasing or maximizing the length of the contact portion between the lift pin 310 and the bush 320, the distortion of the lift pin 310 can be minimized, thereby minimizing the generation of particles between the lift pin 310 and the bush 320. The present disclosure, as described with reference to FIGS. 6 to 8, minimizes friction between the lift pin 310 and the bush 320 by extending the contact portion between the lift pin 310 and the bush 320 to minimize the distortion (or deflection) of the lift pin 310, thereby improving the degree of centering of the lift pin 310.

Third, by adding a bush groove 510 to the upper plate 330*a* constituting the body portion 121*a* of the heating plate 121, bolting can be achieved with the bush 320 first fixed with the upper plate 330*a* and the lower plate 330*b*. The present disclosure can prevent a defect in the centering setting of the lift pin 310 and the bush 320 through the structure described with reference to FIG. 9.

While a few exemplary embodiments of the present disclosure have been described with reference to the accompanying drawings, those skilled in the art will readily appreciate that various changes in form and details may be made therein without departing from the technical idea and scope of the present disclosure as defined by the following claims. Therefore, it is to be understood that the foregoing is illustrative of the present disclosure in all respects and is not to be construed as limited to the specific exemplary embodiments disclosed.

The invention claimed is:

1. An apparatus for treating a substrate, comprising:
a heating unit including a heating plate and configured to heat the substrate;
a cooling unit configured to cool the substrate; and
a transfer unit configured to move the substrate to the heating unit or the cooling unit,
wherein the heating plate comprises:
   a first plate configured to provide a seating surface to the substrate; and
   a second plate disposed under the first plate and installed internally with one or more heaters and one or more bushes,
wherein the bush has a hollow configured to provide a lift pin with a space of movement for allowing the lift pin to be elevated or lowered, and includes a plurality of holes formed to extend from the hollow in an outward direction, and
wherein the second plate of the heating plate includes a plurality of bushes consecutively installed in a height direction, and the bush including the holes is a bush disposed at an uppermost level among the plurality of bushes.

2. The apparatus of claim 1, wherein the holes are formed in a vertical direction with respect to a longitudinal direction of the bush, or are formed to be inclined with respect to the longitudinal direction of the bush.

3. The apparatus of claim 1, wherein the holes are each partially formed on a surface of the bush.

4. The apparatus of claim 3, wherein the hollow of the bush comprises:
   a first subspace; and
   a second subspace that is narrower in width than the first subspace, and
wherein the holes are connected to the first subspace.

5. The apparatus of claim 4, wherein the lift pin has an end configured, when elevated, to pass through the second subspace first, and when lowered, to pass through the first subspace first.

6. The apparatus of claim 1, wherein the second plate of the heating plate is formed internally with passages that connect to the holes and to a suction member for removing particles generated in the hollow of the bush.

7. The apparatus of claim 1, wherein the lift pin comprises:
   a first body; and
   a second body joined with the first body and having a width wider than the first body.

8. The apparatus of claim 7, wherein the lift pin when inserted into the hollow of the bush has the first body positioned above the second body.

9. The apparatus of claim 7, wherein the second body of the lift pin has a width corresponding to at least some of the hollow of the bush.

10. The apparatus of claim 7, wherein the lift pin is adjustable in length with the first body disposed internally of the second body and moving toward and away from second body.

11. The apparatus of claim 7, wherein the second body of the lift pin has a length corresponding to at least some of the hollow of the bush.

12. The apparatus of claim 1, wherein the first plate of the heating plate has a surface formed with a groove, and the bush is fixed to the first plate through the groove.

13. The apparatus of claim 12, wherein the bush comprises:
   a first bush installed on the second plate of the heating plate; and
   a second bush coupled to the first bush and fixed to the first plate through the groove.

14. An apparatus for treating a substrate, comprising:
a heating unit including a heating plate and configured to heat the substrate;
a cooling unit configured to cool the substrate; and
a transfer unit configured to move the substrate to the heating unit or the cooling unit,
wherein the heating plate comprises:
   a first plate configured to provide a seating surface to the substrate; and
   a second plate disposed under the first plate and installed internally with one or more heaters and one or more bushes, and
wherein the bush has a hollow configured to provide a lift pin with a space of movement for allowing the lift pin to be elevated or lowered, and includes a plurality of holes formed to extend from the hollow in an outward direction,
wherein the holes are formed in a vertical direction with respect to a longitudinal direction of the bush or are formed to be inclined with respect to the longitudinal direction of the bush,
wherein the lift pin comprises:
   a first body, and
   a second body joined with the first body and having a width wider than the first body,
wherein the second body has a width corresponding to at least some of the hollow of the bush,
wherein the first plate has a surface formed with a groove, and the bush is fixed to the first plate through the groove, and
wherein the second plate of the heating plate includes a plurality of bushes consecutively installed in a height direction, and the bush including the holes is a bush disposed at an uppermost level among the plurality of bushes.

15. A heating unit provided in an apparatus for processing a substrate, the heating unit comprising:
   a heating plate configured to heat the substrate and comprising:

a body configured to provide a seating surface to the substrate, and one or more heaters installed internally of the body;

a cover configured to cover an upper portion of the heating plate; and an actuator configured to move the cover, wherein the heating plate comprises:

a first plate configured to provide a seating surface to the substrate; and a second plate disposed under the first plate and installed internally with the one or more heaters and one or more bushes, wherein the bush has a hollow configured to provide a lift pin with a space of movement for allowing the lift pin to be elevated or lowered, and includes a plurality of holes formed to extend from the hollow in an outward direction, and wherein the second plate of the heating plate includes a plurality of bushes consecutively installed in a height direction, and the bush including the holes is a bush disposed at an uppermost level among the plurality of bushes.

16. The heating unit of claim 15, wherein the holes are formed in a vertical direction with respect to a longitudinal direction of the bush or are formed to be inclined with respect to the longitudinal direction of the bush.

17. The heating unit of claim 15, wherein the holes are each partially formed on a surface of the bush.

18. The heating unit of claim 17, wherein the hollow of the bush comprises:

a first subspace; and a second subspace that is narrower in width than the first subspace, and wherein the holes are connected to the first subspace.

19. The heating unit of claim 15, wherein the second plate of the heating plate is formed internally with passages that connect to the holes and to a suction member for removing particles generated in the hollow of the bush.

* * * * *